United States Patent
Shirai

(10) Patent No.: US 9,639,114 B2
(45) Date of Patent: May 2, 2017

(54) SPREAD SPECTRUM CLOCK GENERATION CIRCUIT, CLOCK TRANSFER CIRCUIT, INTEGRATED CIRCUIT, AND IMAGE READING APPARATUS

(71) Applicant: CANON KABUSHIKI KAISHA, Tokyo (JP)

(72) Inventor: Takahiro Shirai, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 262 days.

(21) Appl. No.: 14/446,415

(22) Filed: Jul. 30, 2014

(65) Prior Publication Data
US 2015/0052379 A1    Feb. 19, 2015

(30) Foreign Application Priority Data
Aug. 19, 2013  (JP) ................................ 2013-169924

(51) Int. Cl.

| | |
|---|---|
| *G06F 1/00* | (2006.01) |
| *G06F 1/08* | (2006.01) |
| *G06F 1/04* | (2006.01) |
| *H03L 7/08* | (2006.01) |
| *H04N 5/357* | (2011.01) |
| *H04N 5/376* | (2011.01) |

(52) U.S. Cl.
CPC .................. *G06F 1/08* (2013.01); *G06F 1/04* (2013.01); *H03L 7/08* (2013.01); *H04N 5/3577* (2013.01); *H04N 5/3765* (2013.01)

(58) Field of Classification Search
CPC .... G06F 1/08; G06F 1/04; H03L 7/08; H04N 5/3577; H04N 5/3765

USPC ........................................................ 713/501
See application file for complete search history.

(56) References Cited

U.S. PATENT DOCUMENTS

| | | | |
|---|---|---|---|
| 6,294,936 B1 * | 9/2001 | Clementi | H03C 3/095 327/147 |
| 2006/0176525 A1 * | 8/2006 | Mizuta | H04N 1/0473 358/474 |

(Continued)

FOREIGN PATENT DOCUMENTS

| | | |
|---|---|---|
| CN | 101630951 | 1/2010 |
| EP | 655829 | 5/1995 |

(Continued)

OTHER PUBLICATIONS

EESR issued Jan. 19, 2015 in counterpart EPA 14178333.2 (in English).

(Continued)

*Primary Examiner* — Robert Cassity
(74) *Attorney, Agent, or Firm* — Fitzpatrick, Cella, Harper & Scinto

(57) ABSTRACT

A spread spectrum clock generation circuit includes a generation unit configured to generate and output a spread spectrum clock based on an input reference clock, a monitoring unit configured to monitor a difference between the number of pulses of a reference clock input to the generation unit after a reference time and the number of pulses of a spread spectrum clock output from the generation unit after the reference time, and a control unit configured to control a frequency of a spread spectrum clock to be generated by the generation unit so as to make the difference fall within a predetermined range.

11 Claims, 5 Drawing Sheets

(56) References Cited

U.S. PATENT DOCUMENTS

| | | | |
|---|---|---|---|
| 2007/0120989 A1 | 5/2007 | Minami et al. | 348/266 |
| 2008/0165830 A1* | 7/2008 | Tai | H04B 1/7136 |
| | | | 375/132 |
| 2009/0190631 A1* | 7/2009 | Hsieh | G06F 1/04 |
| | | | 375/130 |
| 2011/0169582 A1* | 7/2011 | Kim | H03C 3/0916 |
| | | | 331/1 R |

FOREIGN PATENT DOCUMENTS

| | | |
|---|---|---|
| JP | H10-229399 | 8/1998 |
| JP | 2001-094734 | 4/2001 |
| JP | 2007-150560 | 6/2007 |
| JP | 2007-225863 | 9/2007 |
| JP | 2010-220148 | 9/2010 |

OTHER PUBLICATIONS

Office Action issued Aug. 1, 2016 in counterpart P.R. China patent application 201410398213.4, with translation.

\* cited by examiner

SPREAD SPECTRUM CLOCK GENERATION CIRCUIT, CLOCK TRANSFER CIRCUIT, INTEGRATED CIRCUIT, AND IMAGE READING APPARATUS

BACKGROUND OF THE INVENTION

Field of the Invention

The present invention relates to a spread spectrum clock generation circuit, a clock transfer circuit, an integrated circuit, and an image reading apparatus.

Description of the Related Art

There is known a spread spectrum clock generation circuit which performs spread spectrum for a reference clock having a constant frequency to generate a spread spectrum clock whose frequency varies, in order to reduce EMI (electromagnetic interference). Japanese Patent Laid-Open No. 2007-150560 proposes an image forming apparatus in which the former half of image processing is performed by a former image processing block operating in accordance with a reference clock, and the latter half of the image processing is performed by a latter image processing block operating in accordance with a spread spectrum clock. Output data from the former image processing block is supplied to an external memory controller. The external memory controller stores the data in an external memory. Thereafter, the external memory controller reads out data from the external memory and supplies the data to the latter image processing block. In this manner, the external memory controller operates as a clock transfer circuit.

SUMMARY OF THE INVENTION

When frequency control of the spread spectrum clock generation circuit is disturbed by the influence of a disturbance or the like to cause a spread spectrum clock to deviate from the frequency to be generated, the external memory controller in Japanese Patent Laid-Open No. 2007-150560 cannot read out correct data from the external memory in some cases. If, for example, the frequency of a spread spectrum clock is higher than the frequency to be generated, the amount of data read out from the external memory becomes larger than that of data written in the external memory. As a consequence, the external memory becomes empty. In contrast, if the frequency of a spread spectrum clock is lower than the frequency to be generated, the amount of data read out from the external memory becomes smaller than that of data written in the external memory. As a consequence, the external memory becomes full. Increasing the size of the external memory allows large variations in spread spectrum clock but will increase the cost. According to some aspects of the present invention, there is provided a technique for generating a spread spectrum clock which allows a reduction in the size of a memory used by a clock transfer circuit.

According to an aspect of the present invention, provided is a spread spectrum clock generation circuit comprising a generation unit configured to generate and output a spread spectrum clock based on an input reference clock, a monitoring unit configured to monitor a difference between the number of pulses of a reference clock input to the generation unit after a reference time and the number of pulses of a spread spectrum clock output from the generation unit after the reference time, and a control unit configured to control a frequency of a spread spectrum clock to be generated by the generation unit so as to make the difference fall within a predetermined range.

According to another aspect of the present invention, provided is an integrated circuit comprising a spread spectrum clock generation circuit defined above, an oscillation circuit configured to generate a reference clock supplied to the spread spectrum clock generation circuit, and a circuit element driven by a spread spectrum clock output from the spread spectrum clock generation circuit.

According to yet another aspect of the present invention, provided is a clock transfer circuit comprising a spread spectrum clock generation circuit defined above, a memory, a writing unit configured to write input data in the memory in accordance with a reference clock, and a reading unit configured to read out data from the memory in accordance with a spread spectrum clock output from the spread spectrum clock generation circuit and output the data.

According to still another aspect of the present invention, provided is an image reading apparatus comprising: a clock transfer circuit defined above, an oscillation circuit configured to generate a reference clock supplied to the clock transfer circuit, a reading unit configured to generate image data by reading a document and supply the image data to the clock transfer circuit, and a processing unit configured to process image data output from the clock transfer circuit.

Further features of the present invention will become apparent from the following description of exemplary embodiments (with reference to the attached drawings).

DESCRIPTION OF THE EMBODIMENTS

Figure 1:
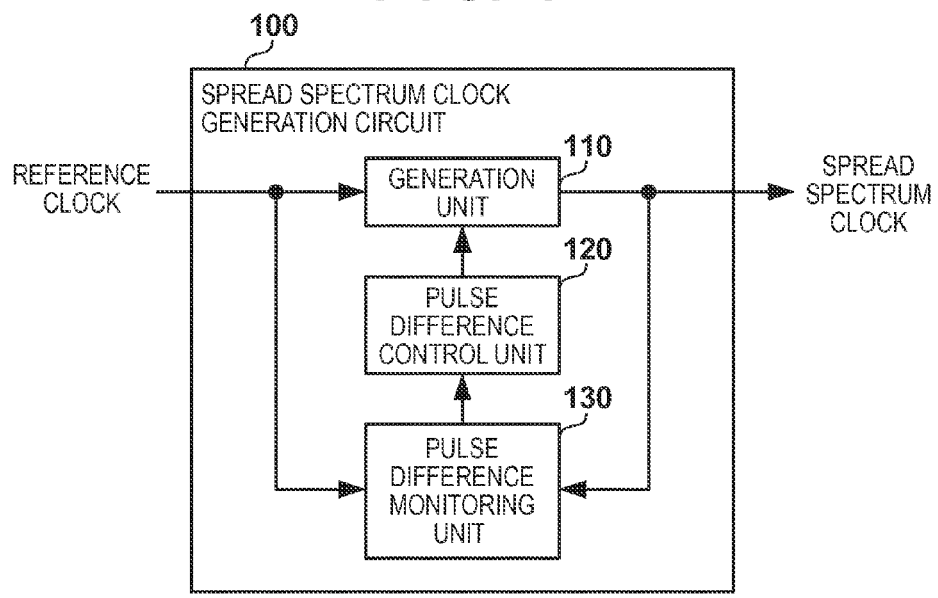
FIG. 1 is a block diagram of a spread spectrum clock generation circuit according to some embodiments.

Embodiments of the present invention will be described below with reference to the accompanying drawings. The same reference numerals throughout various embodiments denote the same elements, and a repetitive description will be omitted. In addition, the respective embodiments may be modified and combined, as needed.

An example of the arrangement of a spread spectrum clock generation circuit 100 according to some embodiments of the present invention will be described with reference to the block diagram of FIG. 1. The spread spectrum clock generation circuit 100 generates a spread spectrum clock based on an externally input reference clock, and outputs the spread spectrum clock to the outside. A reference clock may be a clock whose frequency is constant over time. A spread spectrum clock is a clock obtained by performing spread spectrum for a reference clock, and varies in frequency over time.

The spread spectrum clock generation circuit 100 includes a generation unit 110, a pulse difference control unit 120, and a pulse difference monitoring unit 130. The reference clock input to the spread spectrum clock generation circuit 100 is supplied to the generation unit 110 and the pulse difference monitoring unit 130. The generation unit 110 generates a spread spectrum clock based on the supplied reference clock. The generation unit 110 outputs the generated spread spectrum clock to the outside, and supplies the clock to the pulse difference monitoring unit 130. The generation unit 110 may generate a spread spectrum clock so as to match the average frequency of the reference clock with that of the spread spectrum clock to be output. The pulse difference monitoring unit 130 continuously monitors the difference between the number of pulses of the reference clock input to the generation unit 110 after a given time and the number of pulses of the spread spectrum clock output from the generation unit 110 after the same time. In the following description, this start time is called a reference time, and the difference between the numbers of pulses of the two clocks is called a pulse difference. A pulse difference may be defined as the value obtained by subtracting the number of pulses of a spread spectrum clock from that of a reference clock. In contrast to this, a pulse difference may be defined as the value obtained by subtracting the number of pulses of a reference clock from that of a spread spectrum clock. The pulse difference monitoring unit 130 supplies a signal representing the pulse difference to the pulse difference control unit 120. The pulse difference control unit 120 controls the generation unit 110 to adjust the frequency of the spread spectrum clock output from the generation unit 110 so as to make the pulse difference fall within a predetermined range. The operation of the pulse difference control unit 120 will be described in detail later.

Figure 2:
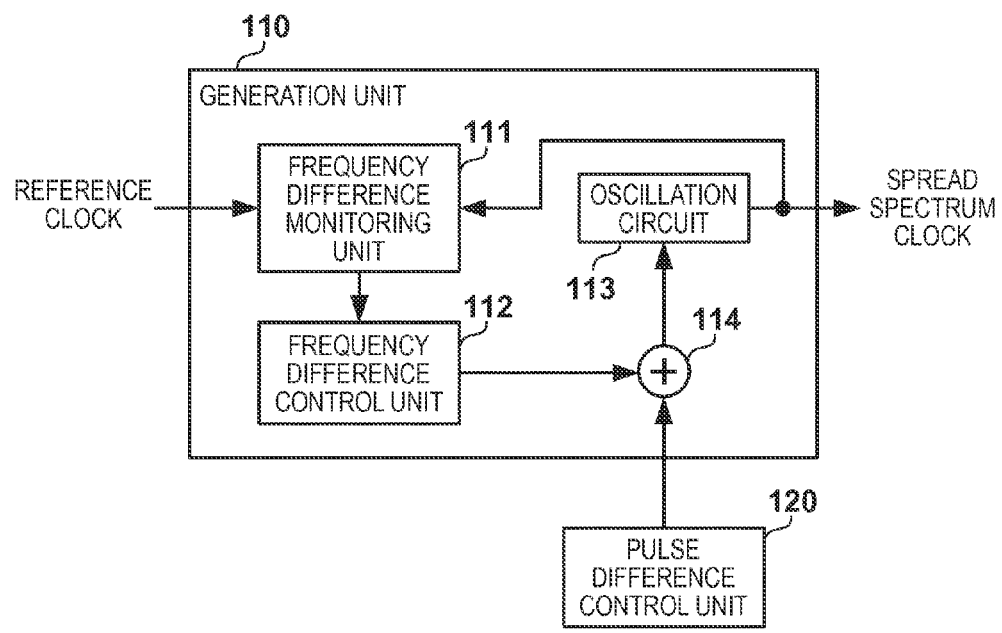
FIG. 2 is a block diagram of a generation unit of the spread spectrum clock generation circuit in FIG. 1.

An example of the arrangement of the generation unit 110 in FIG. 1 will be subsequently described with reference to the block diagram of FIG. 2. The generation unit 110 may include a frequency difference monitoring unit 111, a frequency difference control unit 112, an oscillation circuit 113, and an adder 114. The frequency difference monitoring unit 111 continuously monitors the difference between the average frequency of the reference clock input to the generation unit 110 and the average frequency of the spread spectrum clock output from the generation unit 110. The difference between average frequencies will be simply referred to as the average frequency difference hereinafter. The frequency difference monitoring unit 111 supplies a signal representing the average frequency difference to the frequency difference control unit 112. The frequency difference control unit 112 supplies, to the adder 114, a signal which makes the oscillation frequency of the oscillation circuit 113 vary within a predetermined range at a predetermined period. The adder 114 adds the signal supplied from the frequency difference control unit 112 to the signal supplied from the pulse difference control unit 120 and supplies the resultant signal to the oscillation circuit 113. If no significant signal is supplied from the pulse difference control unit 120 to the adder 114, the oscillation circuit 113 operates in accordance with the signal supplied from the frequency difference control unit 112. The oscillation circuit 113 generates and outputs a spread spectrum clock in accordance with the signal supplied from the adder 114. The frequency difference control unit 112 adjusts the average frequency of the spread spectrum clock generated by the oscillation circuit 113 so as to match the average frequency with that of the reference clock, based on the average frequency difference supplied from the frequency difference monitoring unit 111.

Since the frequency of a reference clock is constant over time, the average frequencies measured in any period are almost constant. On the other hand, the frequency of a spread spectrum clock changes with the lapse of time, and hence the average frequency may change depending on the period in which it is measured. The frequency difference monitoring unit 111 may therefore measure an average frequency in a period in which the average frequency of a spread spectrum clock is almost constant over time when the generation unit 110 operates in a steady state without being influenced by a disturbance or the like. For example, when the frequency difference control unit 112 makes the frequency of a spread spectrum clock periodically vary, the period (to be referred to as the spread modulation period hereinafter) or an integer multiple of the period may be acquired as an average frequency.

According to some embodiments, the frequency difference monitoring unit 111 may have three counters. The first counter counts the number of pulses of a reference clock. The second counter counts the number of pulses of a spread spectrum clock. The third counter counts the time from the instant one of these counters reaches a predetermined count value to the instant the other counter reaches the same count value. The frequency difference monitoring unit 111 supplies an output from the third counter as an average frequency difference to the frequency difference control unit 112.

Since a reference clock is asynchronous with a spread spectrum clock, even if the average frequencies of the two clocks coincide with each other, count values in the same period may differ by about one count. In addition, since a spread spectrum clock varies in frequency with the lapse of time, the difference in count time between a reference clock and a spread spectrum clock varies depending on the counting period. Therefore, the frequency difference monitoring unit 111 may operate so as to tolerate these errors and variations. For example, the above predetermined count value may be set to be larger than the spread modulation period of the frequency, and an output from the frequency difference control unit 112 may be changed only when the count value of the third counter exceeds a threshold. Making the frequency difference control unit 112 operate in this manner can match the average frequency of the spread spectrum clock output from the oscillation circuit 113 with the frequency of the reference clock when observation is performed with a low frequency.

In order to match the average frequency of a reference clock with that of a spread spectrum clock, the generation unit 110 may use a PLL (Phase Locked Loop) which matches a phase of the signal obtained by dividing the reference clock with a phase of the signal obtained by dividing the spread spectrum clock. When a PLL is to be used as well, the time constant of a feedback loop may be set to be larger than a spread modulation period in order to perform frequency modulation of a spread spectrum clock in an intended manner.

Figure 3A:
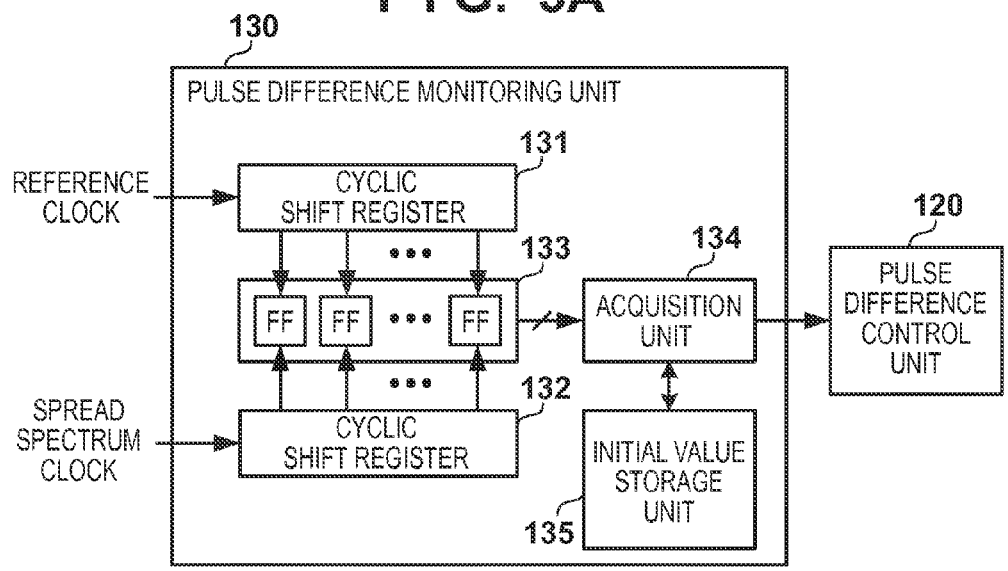
FIGS. 3A and 3B are block diagrams each illustrating the pulse difference monitoring unit of the spread spectrum clock generation circuit in FIG. 1.

An example of the arrangement of the pulse difference monitoring unit 130 in FIG. 1 will be subsequently described with reference to the block diagram of FIG. 3A. The pulse difference monitoring unit 130 shown in FIG. 3A may include two cyclic shift registers 131 and 132, a set/reset flip-flop circuit group 133, an acquisition unit 134, and an initial value storage unit 135. The cyclic shift register 131 may be driven by a reference clock. The cyclic shift register 132 may be driven by a spread spectrum clock. Each of the cyclic shift registers 131 and 132 may have the number of stages equal to or more than the allowable range of pulse differences. Assume that the spread spectrum clock generation circuit 100 should operate so as to make a pulse difference equal to or more than Da and equal to or less than Db (where Da and Db are integers). In this case, each of the cyclic shift registers 131 and 132 may have the number of stages equal to or more than (Db−Da). Each of the cyclic shift registers 131 and 132 may have the number of stages equal to (Db−Da). Assume that in the following description, the width ((Db−Da) in the above case) of the allowable range of pulse differences is represented by M, and each of the cyclic shift registers 131 and 132 has M stages. Each of the cyclic shift registers 131 and 132 outputs H (High) to only one of the M outputs, and outputs L (Low) to the remaining outputs. Each of the cyclic shift registers 131 and 132 changes the terminals to which H is output one by one every time a pulse is input. If, for example, M=3, an output from each of the cyclic shift registers 131 and 132 changes as follows every time a pulse is input:

(LLH)→(LHL)→(HLL)→(LLH)→ . . .

The set/reset flip-flop circuit group 133 may include M set/reset flip-flop circuits. The M output terminals of the cyclic shift register 131 correspond one-to-one to the M set terminals of the M set/reset flip-flop circuits. Each set/reset flip-flop circuit is set upon receiving H from a corresponding output terminal of the cyclic shift register 131. The M output terminals of the cyclic shift register 132 correspond one-to-one to the M reset terminals of the M set/reset flip-flop circuits. Each set/reset flip-flop circuit is reset upon receiving H from a corresponding output terminal of the cyclic shift register 132. The output terminals of the M set/reset flip-flop circuits are connected to the acquisition unit 134. Each set/reset flip-flop circuit outputs H when its internal state is a set state, and outputs L when its internal state is a reset state.

The acquisition unit 134 counts the number of outputs, of M outputs from the set/reset flip-flop circuit group 133, which are set at H, or counts the number of outputs which are set at L. The following will exemplify a case in which the acquisition unit 134 counts the number of H outputs. First of all, the acquisition unit 134 stores the number of H outputs at a reference time in the initial value storage unit 135. Every time any one of M outputs from the set/reset flip-flop circuit group 133 changes, the acquisition unit 134 supplies, to the pulse difference control unit 120, the value obtained by subtracting the value stored in the initial value storage unit 135 from the number of H outputs at that time. This value represents the pulse difference. Based on the pulse difference supplied from the acquisition unit 134, the pulse difference control unit 120 supplies a control signal to the generation unit 110 so as to make the pulse difference fall within a predetermined range.

Figure 3B:
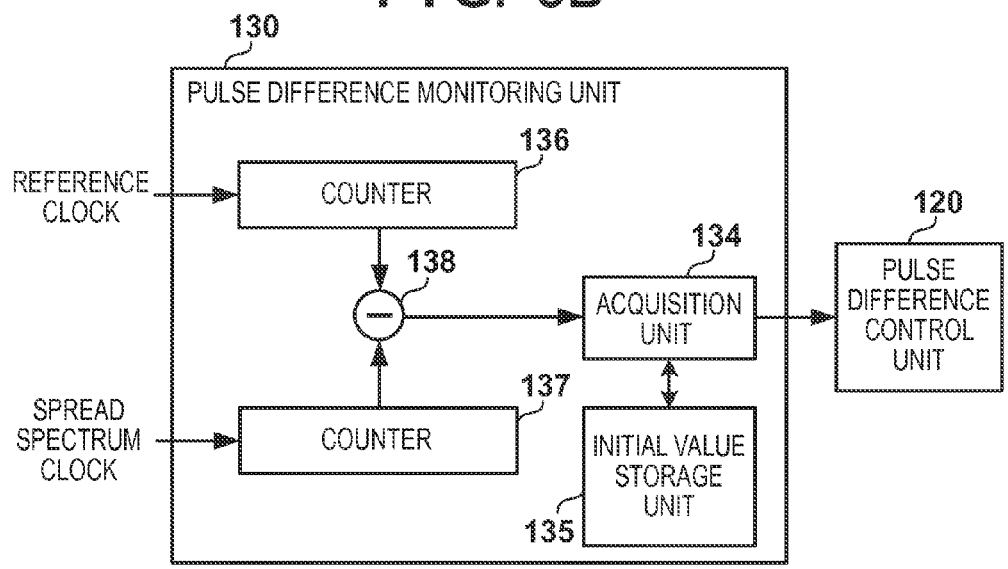

Another example of the arrangement of the pulse difference monitoring unit 130 in FIG. 1 will be subsequently described with reference to the block diagram of FIG. 3B. The pulse difference monitoring unit 130 shown in FIG. 3B may include two counters 136 and 137, a subtracter 138, the acquisition unit 134, and the initial value storage unit 135. The counter 136 counts the number of pulses of a reference clock and supplies the count value to the subtracter 138. The counter 137 counts the number of pulses of a spread spectrum clock and supplies the count value to the subtracter 138. Each of the counters 136 and 137 may count the number of pulses equal to or more than the width (M described above) of the allowable range of pulse differences. The subtracter 138 subtracts the count value supplied from the counter 137 from the count value supplied from the counter 136, and supplies the resultant value to the acquisition unit 134. The counter 137, which operates asynchronously with a reference clock, may output a count value in the form of a gray code. Outputting a count value in the form of a gray code can reduce the count value error input to the subtracter 138 to 1 or less.

First of all, the acquisition unit 134 stores an output value from the subtracter 138 at a reference time in the initial value storage unit 135. Every time an output value from the subtracter 138 changes, the acquisition unit 134 supplies, to the pulse difference control unit 120, the value obtained by subtracting the value stored in the initial value storage unit 135 from the output value at that time. This value represents the pulse difference. Based on the pulse difference supplied from the acquisition unit 134, the pulse difference control unit 120 supplies a control signal to the generation unit 110 so as to make the pulse difference fall within a predetermined range.

Figure 4:
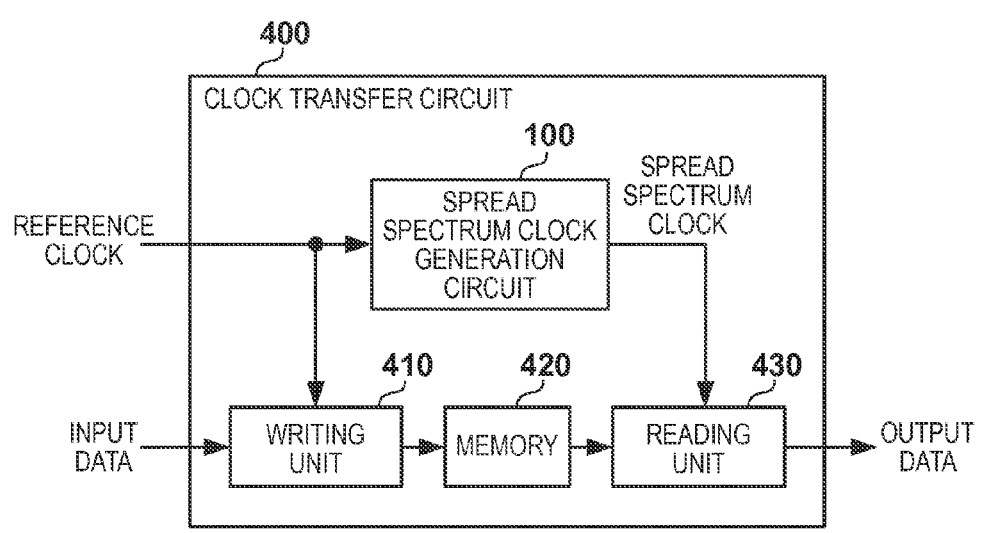
FIG. 4 is a block diagram illustrating a clock transfer circuit according to some embodiments of the present invention.

An example of the arrangement of a clock transfer circuit 400 according to some embodiments of the present invention will be subsequently described with reference to the block diagram of FIG. 4. The clock transfer circuit 400 may include the spread spectrum clock generation circuit 100, a writing unit 410, a memory 420, and a reading unit 430. A reference clock and input data are externally supplied to the clock transfer circuit 400. Input data may be, for example, N-bit digital data. The memory 420 can store M N-bit digital data. The writing unit 410 writes input data in the memory 420 upon changing storage areas one by one every time a pulse of a reference clock is input. The spread spectrum clock generation circuit 100 generates a spread spectrum clock based on the reference clock in the above manner, and supplies the clock to the reading unit 430. The reading unit 430 reads out data from the memory 420 in the FIFO (First-In First-Out) scheme every time a pulse of a spread spectrum clock is input, and outputs the clock to the outside.

Figure 5:
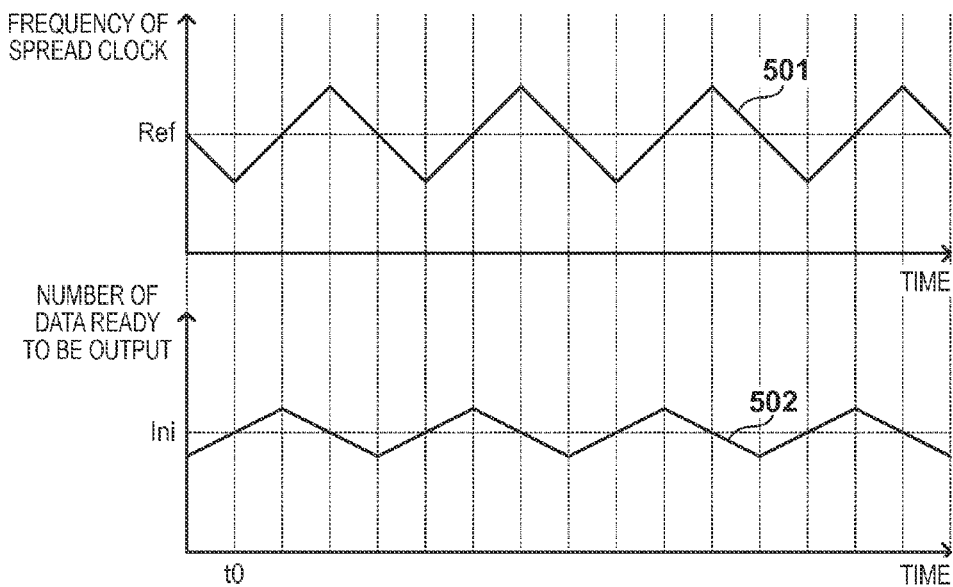
FIG. 5 is a graph for explaining a memory state of the clock transfer circuit in FIG. 4.
Figure 6:
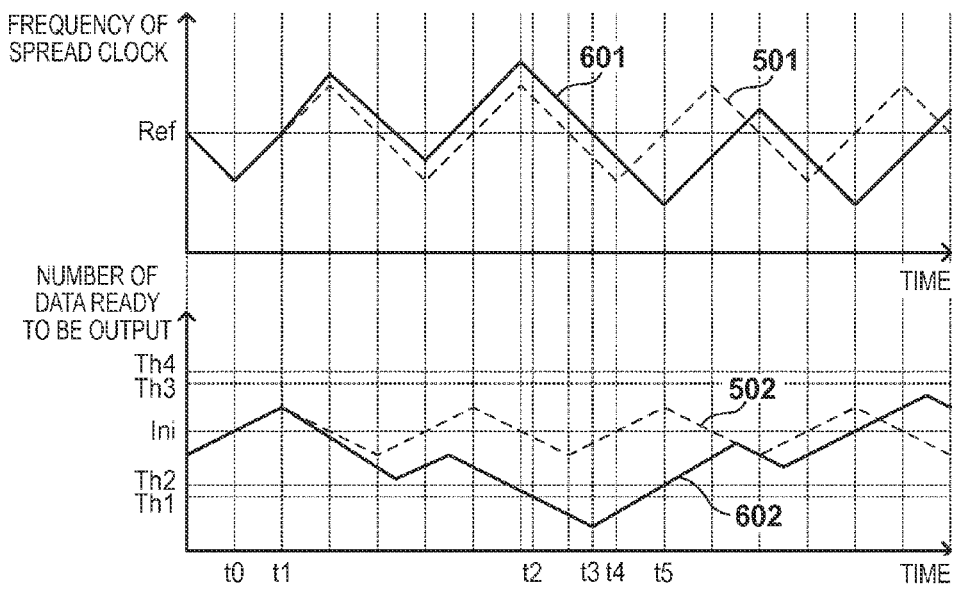
FIG. 6 is a graph for explaining a memory state of the clock transfer circuit in FIG. 4.

An example of the operation of the pulse difference control unit 120 of the spread spectrum clock generation circuit 100 will be subsequently described with reference to the graphs of FIGS. 5 and 6. The following description will be made assuming that the spread spectrum clock generation circuit 100 is mounted in the clock transfer circuit 400. The frequency difference control unit 112 included in the spread spectrum clock generation circuit 100 performs control to match the average frequency of a reference clock with that of a spread spectrum clock. For this reason, the number of data input to the clock transfer circuit 400 can match the number of data output from the clock transfer circuit 400 over a long period of time (for example, a length equal to or more than a spread modulation period). However, since the frequency of a spread spectrum clock changes with the lapse of time, the number of data ready to be output in the memory 420 varies when observed in a short period of time. In this case, data ready to be output represents data which has not been read out after being written in the memory 420.

The manner of how the number of data ready to be output in the memory 420 varies will be described with reference to FIG. 5. The upper graph in FIG. 5 shows a curve 501 representing changes in the frequency of a spread spectrum clock as a function of time. A spread spectrum clock periodically varies up and down relative to a reference clock (Ref in FIG. 5). FIG. 5 shows a case on the assumption that there is no disturbance. In this case, therefore, the average frequency of a spread spectrum clock is equal to that of a reference clock. The lower graph in FIG. 5 shows a curve 502 representing changes in the number of data ready to be output in the memory 420 as a function of time. If the frequency of a spread spectrum clock is higher than that of a reference clock, the number of data ready to be output decreases. If the frequency of a spread spectrum clock is lower than that of a reference clock, the number of data ready to be output increases. For this reason, the number of data ready to be output varies centered on a value Ini at time t0.

The manner of how the number of data ready to be output in the memory 420 varies in the presence of a disturbance will be described next with reference to FIG. 6. The upper graph in FIG. 6 shows a curve 601 representing changes in the frequency of a spread spectrum clock as a function of time. The lower graph in FIG. 6 shows a curve 602 representing changes in the number of data ready to be output in the memory 420 as a function of time. In the case shown in FIG. 6, a disturbance occurs at time t1, and the frequency of a generated spread spectrum clock becomes higher than the frequency which should be generated (a dotted line curve 501). For this reason, the number of data read out from the memory 420 increases. If this state continues, the number of data ready to be output becomes 0, resulting in a readout error. It is also possible to eliminate the influence of such a disturbance by the control of the frequency difference control unit 112. However, since the time constant of a feedback loop in the control of the frequency difference control unit 112 is large, it is sometimes impossible to cope with a case in which a disturbance changes faster than the time constant. If, for example, the temperature of the oscillation circuit 113 rises faster than the response time of the feedback loop due to the heat generated by a peripheral circuit of the oscillation circuit 113, the frequency generated by the oscillation circuit 113 becomes higher than the frequency which should be generated according to the temperature characteristics. In contrast, if generated heat converges slower than the response time of the feedback loop, the deviation from the frequency which should be generated is low. As a consequence, the average frequency of a spread spectrum clock temporarily deviates from the frequency of a reference clock. In addition, even if the average value of pulse differences from a reference time deviates from the initial value Ini, the average frequency of a reference clock sometimes coincides with that of a spread spectrum clock depending on the timing of acquiring the average frequency. The accumulation of such errors may cause a write error and a readout error.

The pulse difference control unit 120 adjusts the frequency of the spread spectrum clock generated by the oscillation circuit 113 so as to make a pulse difference after the reference time (after t0) become equal to or more than −Ini and equal to or less than (M−Ini). If a pulse difference after reference time t0 falls within this range, the number of data ready to be output in the memory 420 becomes equal to or more than 1 and equal to or less than M, and no readout error or write error occurs. The value of Ini may be, for example, M/2. For example, the pulse difference monitoring unit 130 continuously monitors pulse differences with time t0 at which the number of data ready to be output has become M/2 being a reference time.

A concrete example of the detailed operation of the pulse difference control unit 120 will be subsequently described. The pulse difference control unit 120 stores four thresholds Th1 to Th4. All these thresholds are included in the range in which pulse differences should be included. These thresholds may be set together with a range in which pulse differences should be included. Assume that in the following description, the four thresholds Th1 to Th4 are arranged in ascending order. In addition, the initial value Ini is located between Th2 and Th3.

Every time a pulse difference changes, the pulse difference control unit 120 determines whether the number of data ready to be output becomes smaller than Th1 or exceeds Th4 as a result of change in pulse difference from the initial value Ini. The pulse difference output from the pulse difference monitoring unit 130 may change every time a pulse of a reference clock is input and a pulse of a spread spectrum clock is output. In the case shown in FIG. 6, the pulse difference control unit 120 determines at time t2 that the pulse difference has become smaller than (Th1−Ini), that is, the number of data ready to be output has become smaller than Th1. Since the frequency of the spread spectrum clock exhibits a decreasing tendency at time t2, the pulse difference control unit 120 continues the current operation. When the frequency of the spread spectrum clock becomes lower than the frequency of the reference clock at time t3, the number of data ready to be output begins to increase. At time t4, as indicated by the curve 501, the frequency difference control unit 112 supplies a control signal to increase the frequency of the spread spectrum clock to the oscillation circuit 113. The pulse difference control unit 120 supplies a control signal to decrease the frequency of the spread spectrum clock to the oscillation circuit 113 so as to cancel the control of the frequency difference control unit 112. As a result, the frequency of the spread spectrum clock output from the oscillation circuit 113 keeps decreasing even after time t3. Thereafter, at time t5, the pulse difference control unit 120 determines that the number of data ready to be output has exceeded Th2, and performs control to increase the frequency of the spread spectrum clock.

In the above case, when a pulse difference exceeds a threshold, the pulse difference control unit 120 controls the frequency of a spread spectrum clock to reduce the pulse difference so as to make the pulse difference fall within a predetermined range and, as a result, set the number of data ready to be output in the memory 420 to equal to or more than 1 and equal to or less than M. Such control is not limited to the above case. For example, if a pulse difference exceeds thresholds one each of which is set above and below the initial value Ini, the pulse difference control unit 120 may control the frequency of a spread spectrum clock according to a predetermined time and pattern so as to make the pulse difference approach 0. According to an example of the pattern, the pulse difference control unit 120 may keep increasing/decreasing a frequency for a predetermined period so as to exceed the maximum or minimum frequency of a normal control range or may keep a frequency exceeding the maximum or minimum frequency for a predetermined period. Alternatively, the pulse difference control unit 120 may change an average frequency at the time of normal control by changing a modulation speed above and below the average frequency. In the above case, the pulse difference control unit 120 continuously changes the frequency of a spread spectrum clock. However, the pulse difference control unit 120 may discretely change the frequency.

As described above, the spread spectrum clock generation circuit 100 can control a spread spectrum clock so as to make a pulse difference fall within a predetermined range, even if a disturbance or the like has occurred. This makes it possible to reduce the size of a memory used by the clock transfer circuit 400 by setting an allowable range of pulse differences in accordance with the size of the memory 420 which is decided in advance.

Figure 7:
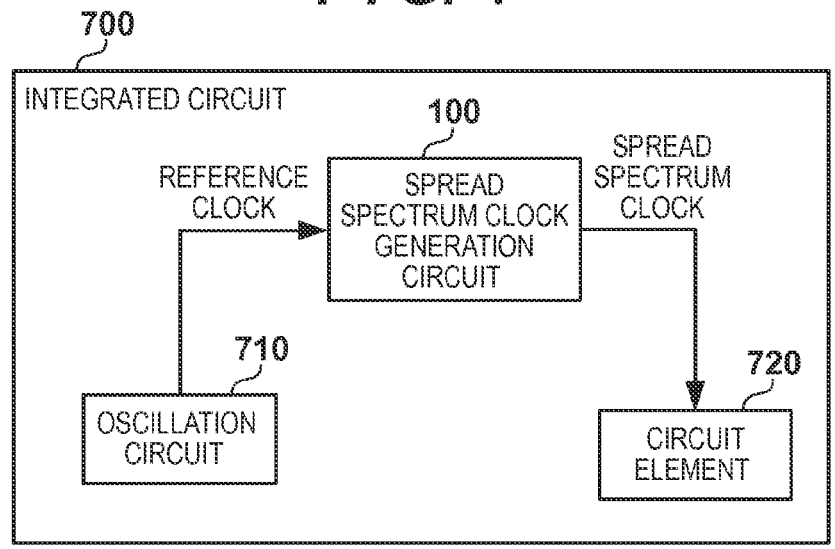
FIG. 7 is a block diagram of an integrated circuit according to some embodiments of the present invention.

An example of the arrangement of an integrated circuit 700 according to some embodiments of the present invention will be subsequently described with reference to the block diagram of FIG. 7. The integrated circuit 700 may be a semiconductor integrated circuit. The integrated circuit 700 may include the spread spectrum clock generation circuit 100, an oscillation circuit 710, and a circuit element 720. The oscillation circuit 710 generates a reference clock and supplies it to the spread spectrum clock generation circuit 100. As described above, the spread spectrum clock generation circuit 100 generates a spread spectrum clock based on a reference clock, and supplies the spread spectrum clock to the circuit element 720. The circuit element 720 operates in accordance with the supplied spread spectrum clock. The circuit element 720 may be, for example, a flip-flop circuit.

Figure 8:
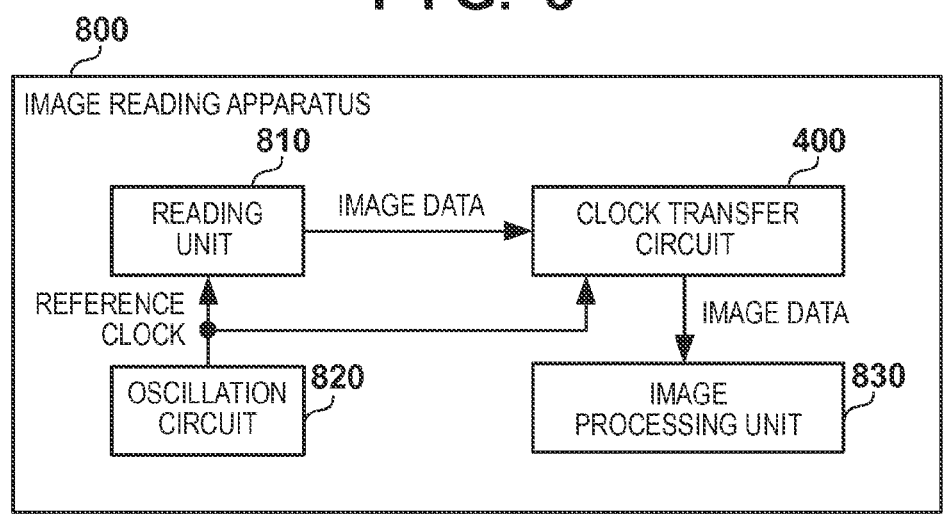
FIG. 8 is a block diagram of an image reading apparatus according to some embodiments of the present invention.

An example of the arrangement of an image reading apparatus 800 according to some embodiments of the present invention will be subsequently described with reference to the block diagram of FIG. 8. The image reading apparatus 800 may be, for example, an MFP (Multi Function Peripheral), scanner, or a copying machine. The image reading apparatus 800 may include the clock transfer circuit 400, a reading unit 810, an oscillation circuit 820, and an image processing unit 830. The reading unit 810 generates image data by reading a document. The reading unit 810 may be constituted by a light source, a reduction optical component, a line sensor, an analog/digital converter, a controller, and the like. The oscillation circuit 820 generates a reference clock and supplies it to the reading unit 810 and the clock transfer circuit 400. The reading unit 810 operates in accordance with the supplied reference clock. The frequency of a reference clock may be, for example, several 100 MHz. As described above, the clock transfer circuit 400 receives image data from the reading unit 810 in accordance with a reference clock and supplies the image data to the image processing unit 830 in accordance with a spread spectrum clock. The image processing unit 830 processes the supplied image data. The reading unit 810, the oscillation circuit 820, and the clock transfer circuit 400 may be mounted in the movable portion of the image reading apparatus 800. The image processing unit 830 may be mounted in the main body portion of the image reading apparatus 800. The clock transfer circuit 400 and the image processing unit 830 may be connected to each other via a wire harness of several ten cm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-169924, filed Aug. 19, 2013, which is hereby incorporated by reference herein in its entirety.

What is claimed is:

1. A spread spectrum clock generation circuit comprising:
a generation unit that has a terminal to receive a reference clock and that generates a spread spectrum clock based on the reference clock;
a monitoring unit configured to monitor a difference between the number of pulses of a reference clock input to the generation unit after a reference time and the number of pulses of a spread spectrum clock output from the generation unit after the reference time, the monitoring unit including
a first cyclic shift register driven by the reference clock,
a second cyclic shift register driven by the spread spectrum clock,
a set/reset flip-flop circuit group, an internal state of which is determined in accordance with an output from the first cyclic shift register and an output from the second cyclic shift register, and
an acquisition unit that is electrically connected to the set/reset flip-flop circuit group to acquire the difference based on an output from the set/reset flip-flop circuit group; and
a controller configured to control a frequency of a spread spectrum clock to be generated by the generation unit so as to make the difference fall within the number of stages of each of the first and second cyclic shift registers,
wherein a frequency of the reference clock is constant over time.

2. The circuit according to claim 1, wherein the controller is configured to determine whether the difference exceeds a threshold, and control, if the difference exceeds the threshold, a frequency of a spread spectrum clock to be generated by the generation unit so as to reduce the difference.

3. The circuit according to claim 2, wherein the controller is configured to perform the determination every time the difference changes.

4. The circuit according to claim 2, wherein the controller is configured to perform the determination every time the reference clock is input to the generation unit and the spread spectrum clock is output from the generation unit.

5. The circuit according to claim 1, wherein the number of stages of the first cyclic shift register is equal to the number of stages of the second cyclic shift register, and
the set/reset flip-flop circuit group includes set/reset flip-flop circuits equal in number to the number of stages of the first cyclic shift register.

6. An integrated circuit comprising:
a spread spectrum clock generation circuit defined in claim 1;
an oscillation circuit configured to generate a reference clock supplied to the spread spectrum clock generation circuit; and
a circuit element driven by a spread spectrum clock output from said the spread spectrum clock generation circuit.

7. A clock transfer circuit comprising:
a spread spectrum clock generation circuit defined in claim 1;
a memory;
a writer configured to write input data in the memory in accordance with a reference clock; and
a reader configured to read out data from the memory in accordance with a spread spectrum clock output from the spread spectrum clock generation circuit and output the data.

8. An image reading apparatus comprising:
a clock transfer circuit defined in claim 7;
an oscillation circuit configured to generate a reference clock supplied to the clock transfer circuit;
a reader configured to generate image data by reading a document and supply the image data to the clock transfer circuit; and
a processor configured to process image data output from the clock transfer circuit.

9. The apparatus defined in claim 8,
wherein the number of stages of the first cyclic shift register is M and the number of stages of the second cyclic shift register is M, and
wherein the clock transfer circuit comprises:
a memory configured to store at least M data; and
a reader configured to read out data from the memory every time a pulse of the spread spectrum clock is input, and wherein the controller controls the frequency of the spread spectrum clock so that the number of data ready to be output in the memory is equal to or less than M.

10. A copying apparatus comprising:
a clock transfer circuit defined in claim 7;
an oscillation circuit configured to generate a reference clock supplied to the clock transfer circuit;
a reader configured to generate image data by reading a document and supply the image data to the clock transfer circuit; and
a processor configured to process image data output from the clock transfer circuit.

11. The apparatus defined in claim 10,
wherein the number of stages of the first cyclic shift register is M and the number of stages of the second cyclic shift register is M, and
wherein the clock transfer circuit comprises:
a memory configured to store at least M data; and
a reader configured to read out data from the memory every time a pulse of the spread spectrum clock is input, and
wherein the controller controls the frequency of the spread spectrum clock so that the number of data ready to be output in the memory is equal to or less than M.

* * * * *